(12) United States Patent
Van Der Zouw et al.

(10) Patent No.: US 12,460,971 B2
(45) Date of Patent: Nov. 4, 2025

(54) WAVELENGTH SELECTION MODULE, ILLUMINATION SYSTEM AND METROLOGY SYSTEM

(71) Applicant: ASML Netherlands B.V., Veldhoven (NL)

(72) Inventors: Gerbrand Van Der Zouw, Waalre (NL); Marinus Johannes Maria Van Dam, Venlo (NL); Jacob Sonneveld, Best (NL); Ramon Pascal Van Gorkom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 567 days.

(21) Appl. No.: 17/636,308

(22) PCT Filed: Jul. 23, 2020

(86) PCT No.: PCT/EP2020/070749
§ 371 (c)(1),
(2) Date: Feb. 17, 2022

(87) PCT Pub. No.: WO2021/032400
PCT Pub. Date: Feb. 25, 2021

(65) Prior Publication Data
US 2022/0299365 A1 Sep. 22, 2022

(30) Foreign Application Priority Data
Aug. 21, 2019 (EP) .................................. 19192883

(51) Int. Cl.
*G01J 3/12* (2006.01)
*G01J 3/02* (2006.01)
*G03F 7/00* (2006.01)

(52) U.S. Cl.
CPC ............... *G01J 3/12* (2013.01); *G01J 3/0237* (2013.01); *G03F 7/70575* (2013.01);
(Continued)

(58) Field of Classification Search
CPC .... G01J 3/12; G01J 3/0237; G01J 2003/1234; G01J 2003/1243; G03F 7/70575; G03F 7/70616
See application file for complete search history.

(56) References Cited

U.S. PATENT DOCUMENTS

| 6,320,996 B1 | 11/2001 | Scobey et al. |
| 10,715,771 B1 * | 7/2020 | Gerlach .................. H04N 9/03 |

(Continued)

FOREIGN PATENT DOCUMENTS

| JP | 2016-218144 A | 12/2016 |
| KR | 2018-0110104 A | 10/2018 |

(Continued)

OTHER PUBLICATIONS

International Preliminary Report Patentability directed to related International Patent Application No. PCT/EP2020/070749, issued Feb. 17, 2022; 7 pages.
(Continued)

*Primary Examiner* — Bumsuk Won
*Assistant Examiner* — John Curtis Sipes
(74) *Attorney, Agent, or Firm* — Sterne, Kessler, Goldstein & Fox P.L.L.C.

(57) ABSTRACT

Disclosed is a wavelength selection module for a metrology apparatus. The wavelength selection module comprises one or more filter elements being operable to receive an input radiation beam comprising multiple wavelengths to provide selective control of a wavelength characteristic of a corre-
(Continued)

sponding output radiation beam. At least one of said one or more filter elements comprises at least two linear variable filters.

17 Claims, 5 Drawing Sheets

(52) U.S. Cl.
CPC .. *G03F 7/70616* (2013.01); *G01J 2003/1234* (2013.01); *G01J 2003/1243* (2013.01)

(56) References Cited

U.S. PATENT DOCUMENTS

| | | |
|---|---|---|
| 10,775,704 B2 | 9/2020 | Pandey et al. |
| 2002/0171834 A1* | 11/2002 | Rowe .................... G01J 3/0218 356/418 |
| 2009/0039292 A1* | 2/2009 | Lee ..................... G03F 7/70283 250/492.2 |
| 2014/0057585 A1* | 2/2014 | Kakinuma ............... H03D 7/00 455/323 |
| 2014/0312212 A1 | 10/2014 | Schappacher |
| 2017/0149411 A1* | 5/2017 | Nielsen ............... H03H 11/1208 |
| 2017/0219487 A1* | 8/2017 | Hill .................... G03F 7/706851 |
| 2017/0343825 A1* | 11/2017 | Sinha ........................ G01J 3/02 |
| 2018/0052099 A1 | 2/2018 | Hill et al. |
| 2018/0252518 A1* | 9/2018 | Chalmers ............. G02B 21/248 |
| 2018/0292326 A1 | 10/2018 | Manassen et al. |
| 2019/0041329 A1 | 2/2019 | Hill et al. |
| 2019/0292326 A1 | 9/2019 | Chang |
| 2019/0384184 A1* | 12/2019 | Pandey ................ G01N 21/956 |
| 2021/0307612 A1* | 10/2021 | Kang .................... G01J 3/2823 |

FOREIGN PATENT DOCUMENTS

| | | |
|---|---|---|
| TW | 434424 B | 5/2011 |
| WO | WO 2017/153130 A1 | 9/2017 |

OTHER PUBLICATIONS

International Search Report and Written Opinion of the International Searching Authority directed to related International Patent Application No. PCT/EP2020/070749, mailed Oct. 23, 2020; 10 pages.

* cited by examiner

WAVELENGTH SELECTION MODULE, ILLUMINATION SYSTEM AND METROLOGY SYSTEM

CROSS-REFERENCE TO RELATED APPLICATIONS

This application claims priority of EP application 19192883.7 which was filed on Aug. 21, 2019 and which is incorporated herein in its entirety by reference.

BACKGROUND

Field of the Invention

The present invention relates to methods and apparatus of lithography usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

When performing such dark field scatterometery, different targets in different layers may show different behavior to different wavelength measurement radiation. Measurement radiation should therefore be individually tuned to a target and/or layer. Metrology apparatuses may be configured to allow wavelength selection from a few, typically around 7 to 10, discrete wavelengths evenly spread over the complete spectrum (which may range from 400 to 900 nm).

Improved switching speed between wavelengths is desirable to increase measurement throughput.

SUMMARY OF THE INVENTION

The invention in a first aspect provides a wavelength selection module for a metrology apparatus comprising: one or more filter elements being operable to receive an input radiation beam comprising multiple wavelengths to provide selective control of a wavelength characteristic of a corresponding output radiation beam; wherein at least one of said one or more filter elements comprises at least two linear variable filters.

The invention further provides for an illumination system comprising an illumination source for generating said input radiation beam and the wavelength selection module of the first aspect;

The invention further provides for a metrology apparatus for measuring a parameter of a lithographic process, the metrology apparatus comprising the illumination system of the second aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
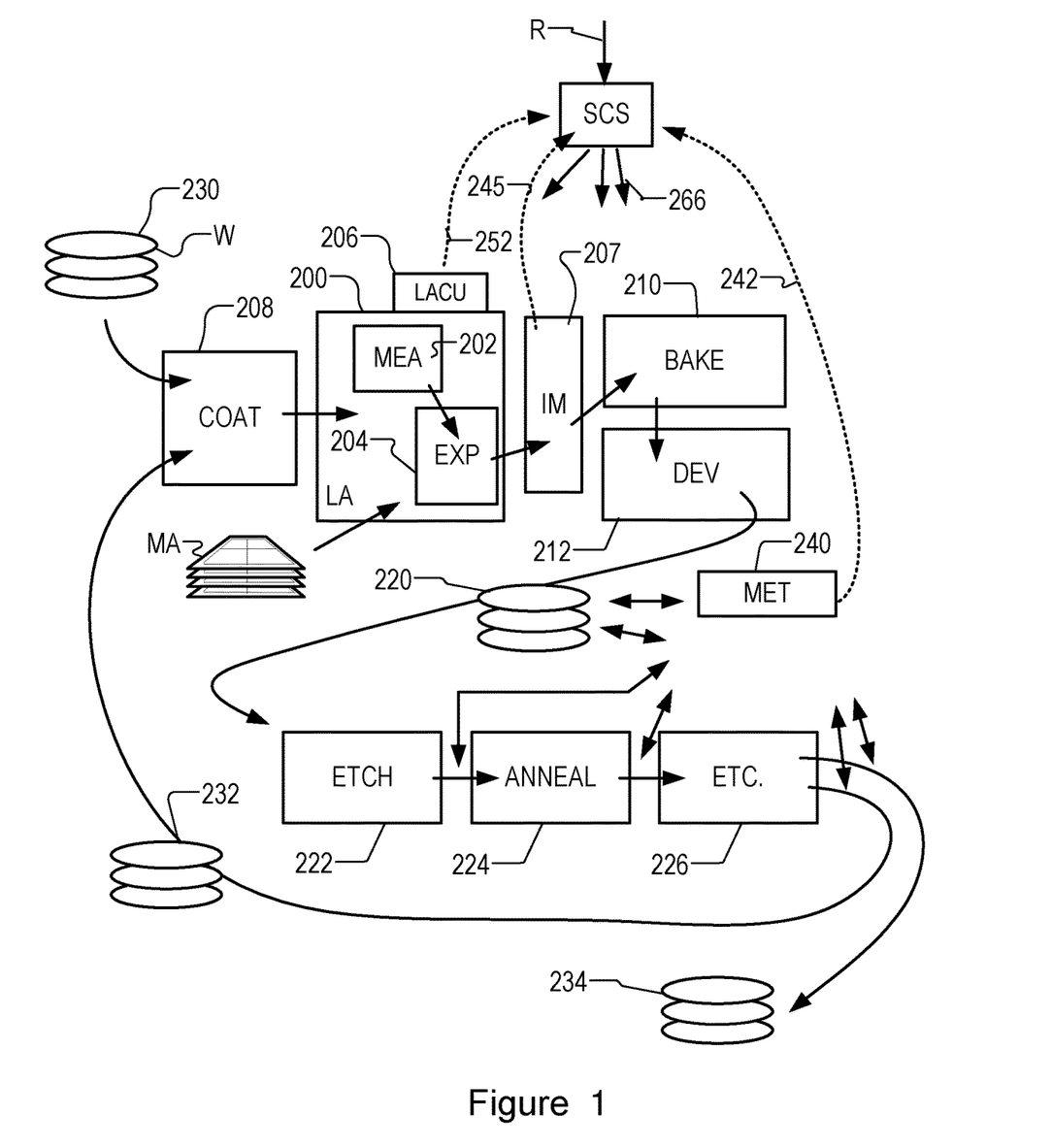
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figures 2A, 2B:
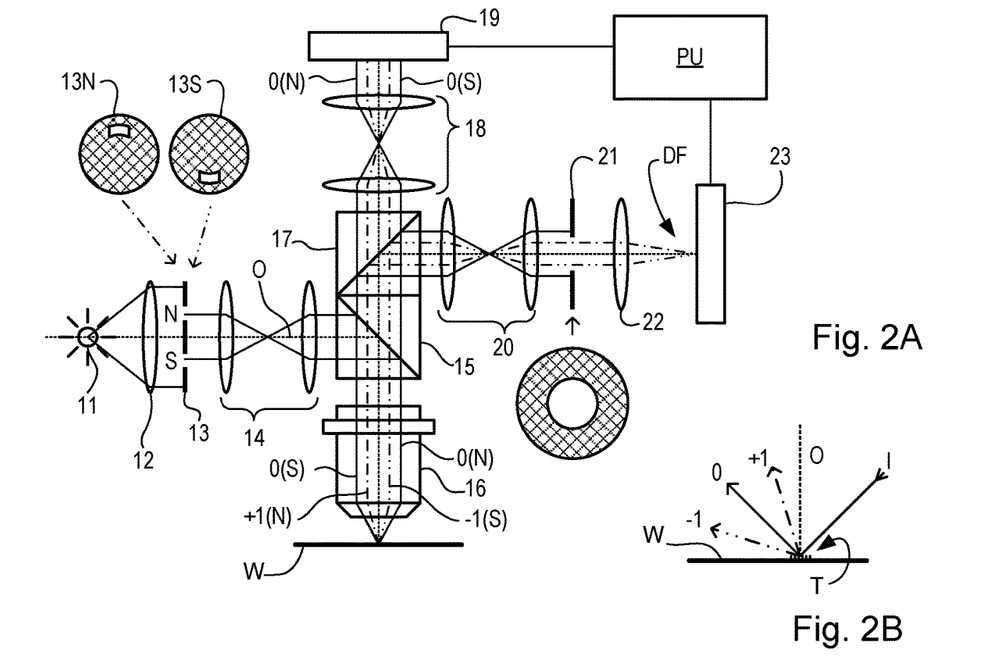
FIGS. 2A-2B comprise 2A a schematic diagram of a dark field scatterometer for use in measuring targets using a first pair of illumination apertures, 2B a detail of diffraction spectrum of a target grating for a given direction of illumination.

A metrology apparatus is shown in FIG. 2(a). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line+1 and double dot-chain line−1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

Metrology apparatuses may allow selection of the wavelength of the measurement radiation. The measurement radiation from the source 11 may be filtered such that a specific measurement can be performed. The wavelength may be adjusted once per full substrate measurement. The optimal wavelength may be layer dependent. In some cases, the metrology apparatus may comprise a small number, possibly in the region of about 7 to 10, discrete filters to filter the measurement radiation, thereby enabling wavelength selection from only the same number of possible wavelengths. This can limit performance. Additionally, current switch time between discrete wavelengths is long and therefore can be adjusted only once per total substrate measurement.

To address this, PCT application WO2017/153130 (which is incorporated herein by reference) describes replacing the discrete filters with one or more linear variable filters (LVFs). An LVF is a filter having spectral properties which vary substantially linearly with position in one (or more) direction along the filter. By moving the filter relative to a radiation beam (either by physically moving the filter, beam or both) such that the position which the beam passes through the filter is varied, the filtered beam wavelength may be varied linearly across a wide range of wavelengths (for example, between 400 nm and 900 nm). The output radiation beam may be a beam of measurement radiation for use in a metrology apparatus such as that illustrated in FIG. 2(a).

More specifically, WO2017/153130 described mounting the linear variable filter onto a rotatably mounted filter element, such as a wheel or glass carrier. One color selection module described in WO2017/153130 comprises a single tunable band pass filter where the output wavelength is selected simply by the spatial position of the beam on the filter. Another color selection module described therein comprises two such rotatably mounted filter elements in series: a first filter element comprising a short pass LVF (low-pass LVF or low-pass filter) and a second filter element comprising a long pass LVF (high-pass LVF or high-pass filter), thereby providing a band-pass filter. The two rotatably mounted filter elements typically have individually controllable angular position such that the pass band and central wavelength is selectable.

Figure 3A:
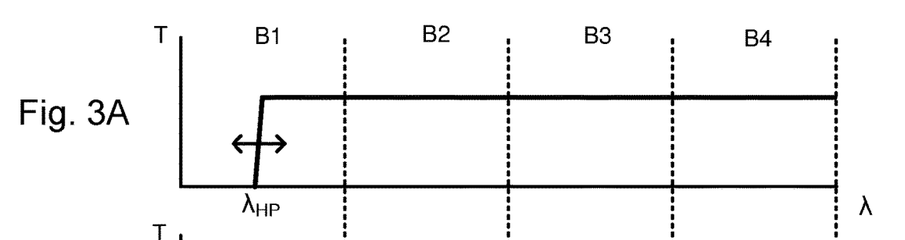
FIGS. 3A-3C show three transmission spectra for respectively: a first filter element, a second filter element and the spectrum resultant from sequential combination of the first and second filter elements, obtained using a prior art color selection arrangement.
Figure 3B:
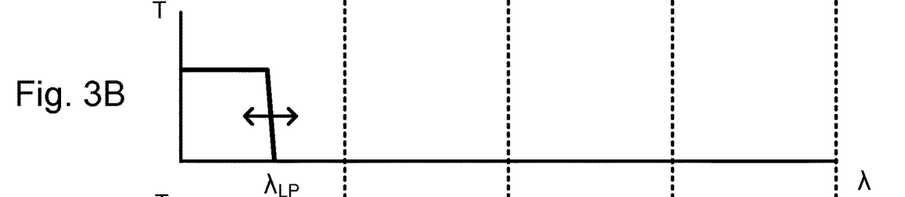
Figure 3C:
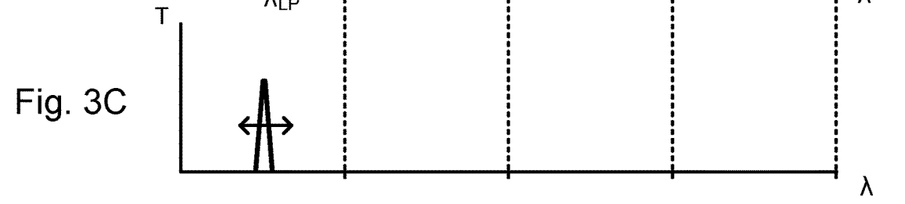

FIG. 3 is a plot of transmission T (e.g., intensity) against wavelength λ for (a) a first filter element, (b) a second filter element and (c) the serial combination of the two filter elements (i.e., the resultant spectrum) in an example two-element arrangement describe in the aforementioned WO2017/153130. The first filter element comprises a high-pass filter with a variable (as indicated by double-headed arrow) cut-on wavelength $\lambda_{HP}$. The second filter element comprises a low-pass filter with a variable (as indicated by double-headed arrow) cut-off wavelength $\lambda_{LP}$. The plots show the arrangement at a particular position of the radiation beam on each filter. By moving the position of the beam on each filter (e.g., by rotating one or both filters or otherwise) the cut-on $\lambda_{HP}$ and cut-off $\lambda_{LP}$ wavelengths are varied. FIG. 3(c) shows that radiation in any narrow wavelength band may be selected in the range covered by the filters by controlling cut-on $\lambda_{HP}$ and cut-off $\lambda_{LP}$ wavelengths such that these wavelengths are close, while $\lambda_{HP} < \lambda_{LP}$. Moving the two filter elements together like this moves the selected narrow wavelength across the available wavelength range, while moving only one of the filter elements (maintaining $\lambda_{HP}<\lambda_{LP}$) varies the width of the selected band.

While such an arrangement is faster and more flexible than using discrete filters, there is still a significant time duration in rotating the filter element(s), particularly when it is required to rotate over large angles. Any reduction in wavelength selection time can have significant throughput benefits.

It is therefore proposed to provide a wavelength or color section module having two (e.g., rotatably mounted) filter elements in series, wherein at least one of the two filter elements comprises at least two separate filters. The term filter below should be understood to encompass an LVF or similar variable filter.

In some embodiments, the two filters may be overlapping low-pass and high-pass filters, therefore providing one or more band-pass filters, in at least some regions of one or both filter elements. In an embodiment, one or both filter elements comprise one or more regions, each region comprising a different band-pass filter encompassing a different wavelength band. The different wavelength bands in different regions may comprise different sub-bands of the wavelength range covered by the color section module. In some embodiment, one or both filter elements may additionally comprise one or more regions comprising only a low-pass filter or a high-pass filter.

Figure 4:
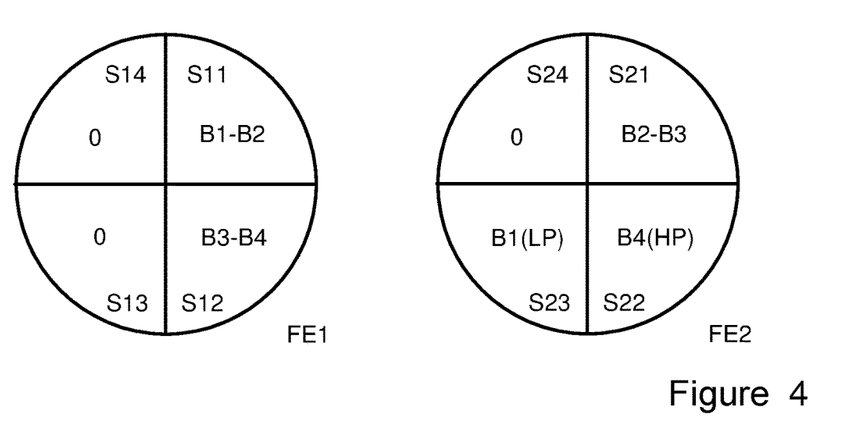
FIG. 4 shows a filter element pair of a color selection arrangement according to a first embodiment of the invention.

FIG. 4 illustrates an example filter arrangement for a pair of (e.g., rotatably mounted) filter elements using the principles just described. Note that, in FIG. 3 (and FIGS. 5 and 6 below), the wavelength range has been divided into four sub-bands B1, B2, B3, B4. This division is largely arbitrary and is done for better understanding of the principles disclosed herein. In particular, the sub-bands covered by each region of each filter element will be described, purely by way of example, in terms of these four sub-bands.

It should be appreciated that it is not necessary for the filter elements to be rotatably mounted; relative movement of the radiation beam on each filter may be effected in a number of ways, including control of the beam on the filters (e.g., by movable directing mirrors or lenses), by linear or other movement of the filter elements or any other suitable method (including any of the arrangements disclosed in WO2017/153130).

FIG. 4 shows a first filter element FE1 and second filter element FE2. First filter element FE1 is divided into four regions or filter slots S11, S12, S13, S14, of which two S13, S14 are empty (signified by zeroes) and two S11, S12 are filled:

first filter slot S11 comprising a high-pass filter having a cut-on wavelength $\lambda_{HP}$ variable at least within sub-band B1 in serial combination with a low-pass filter having a cut-off wavelength $\lambda_{LP}$ variable at least within sub-band B2, thereby defining a passband B1-B2 bridging sub-band B1 and sub-band B2; and second filter slot S12 comprising a high-pass filter having a cut-on wavelength $\lambda_{HP}$ variable at least within sub-band B3 in serial combination with a low-pass filter having a cut-off wavelength $\lambda_{LP}$ variable at least within sub-band B4, thereby defining a passband B3-B4 bridging sub-band B3 and sub-band B4.

Second rotatably mounted filter element FE2 is also divided into four regions or filter slots S21, S22, S23, S24, of which one S24 is empty and three S21, S22, S23 are filled:

first filter slot S21 comprising a high-pass filter having a cut-on wavelength $\lambda_{HP}$ variable at least within sub-band B2 in serial combination with a low-pass filter having a cut-off wavelength $\lambda_{LP}$ variable at least within sub-band B3, thereby defining a passband B2-B3 bridging sub-band B2 and sub-band B3;

second filter slot S22 comprising a high-pass filter having a cut-on wavelength $\lambda_{HP}$ variable at least within sub-band B4; and third filter slot S23 comprising a low-pass filter having a cut-off wavelength $\lambda_{LP}$ variable at least within sub-band B1.

In each example of a filter slot comprising overlapping (sequential) high-pass and low-pass filters to provide a band-pass filter, it is proposed in an embodiment that these filters are in a fixed position relative to each other (e.g., they may be fixed or bonded together, for example by using a suitable adhesive). As before, the cut-on wavelength $\lambda_{HP}$ for the high-pass filter should be smaller than the cut-off wavelength $\lambda_{LP}$ for the low-pass filter; i.e., $\lambda_{HP}<\lambda_{LP}$. In this manner, the bandwidth of the passbands will be fixed, with the spectral position of each passband being variable (e.g., within a sub-range of the full range of the color section module) based on the positon of each filter element with respect to the beam.

Figures 5A, 5B:
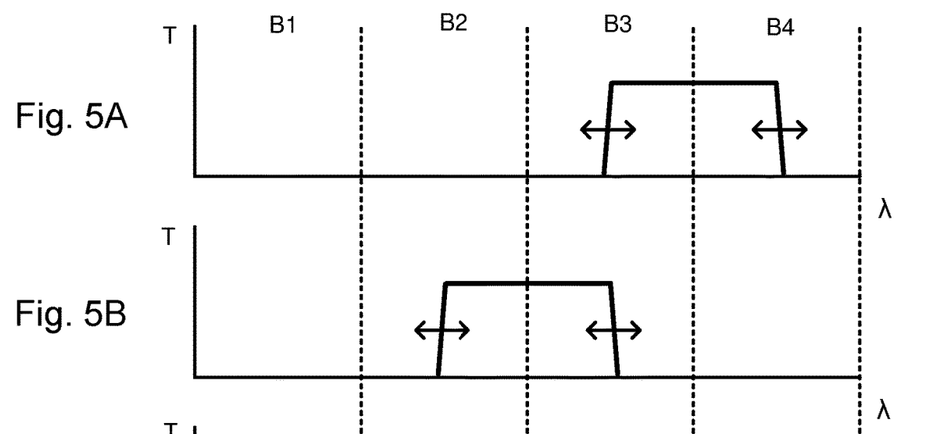
FIGS. 5A-5C show three transmission spectra for respectively: the first filter element, the second filter element and the spectrum resultant from sequential combination of the first and second filter elements, obtained using the filter element pair of FIG. 4 in a first configuration.
Figure 5C:
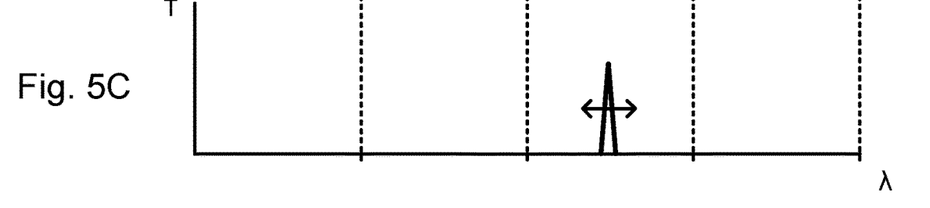

FIG. 5 illustrates is an equivalent plot to that of FIG. 3, for a specific arrangement of the pair of filter elements illustrated in FIG. 4. FIG. 5(a) shows the transmission spectrum of the first filter element FE1, which is oriented such that the beam is incident on slot S12 (e.g., passband B3-B4). FIG. 5(b) shows the transmission spectrum of the second filter element FE2, which is oriented such that the beam is incident on slot S21 (e.g., passband B2-B3). By controlling the relative position of the two filter elements with respect to the beam, a narrow wavelength band can be selected within sub-band B3, as is illustrated in the resulting transmission spectrum of FIG. 4(c). The actual position (and bandwidth) of this selected wavelength can be tuned within sub-band B3 by tuning the positions (e.g., by rotation) of the pair of filter elements so as to tune where the input beam is incident on each filter element within these slots.

Figure 6A:
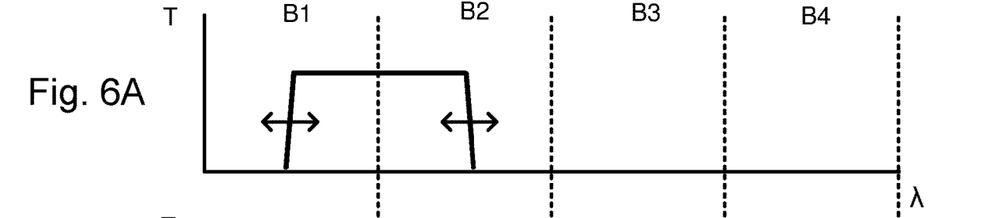
FIGS. 6A-6C show three transmission spectra for respectively: the first filter element, the second filter element and the spectrum resultant from sequential combination of the first and second filter elements, obtained using the filter element pair of FIG. 4 in a second configuration.
Figure 6B:
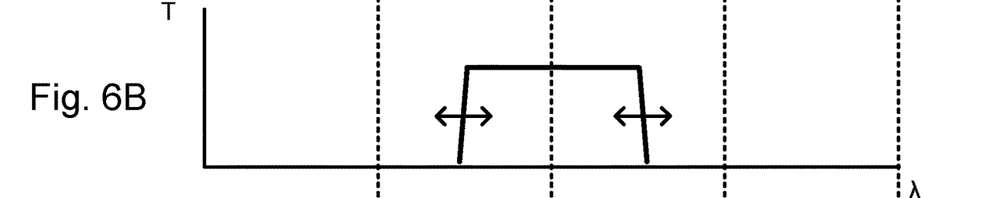
Figure 6C:
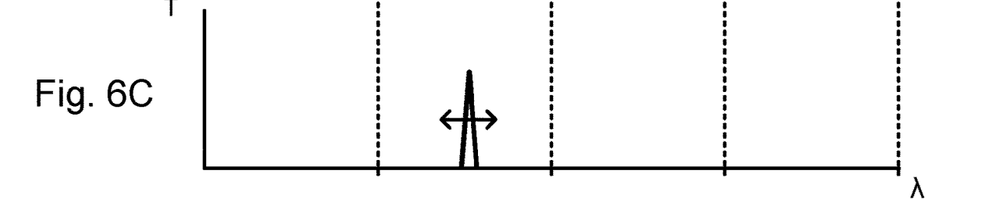

FIG. 6 shows a similar plot to that of FIG. 5, but where the first filter element FE1 has oriented such that the beam is incident on slot S11 (e.g., passband B1-B2), as illustrated by the transmission spectrum of FIG. 6(a). FIG. 6(b) is the same as FIG. 5(b); i.e., the second filter element FE2 is in the same position. The resulting spectrum of FIG. 6(c) shows a narrow wavelength band selected within sub-band B2.

Expanding on the above, it becomes clear that the number of filter slots on each rotatably mounted filter element can be reduced (compared to a present arrangement). Furthermore, the overall speed in wavelength selection (e.g., change) can be increased, by reducing the number of large rotations (e.g., 180 degree as opposed to 90 degree) which are necessary.

The filter slot reduction can be appreciated by considering the example arrangement of FIG. 4, where only five of a possible eight slots are filled (two slots S11, S12 of element FE1 and three slots S21, S22, S23 of element FE2. In the prior art example described by FIG. 3, each filter element would have to cover the full wavelength range, and would extend over all slots (e.g., substantially or close to the full 360 degrees of the filter element).

Table 1 below shows that all four sub-bands B1, B2, B3 and B4 can be covered with such an arrangement (e.g., the specific arrangement of FIG. 4). In the table, the first three columns relate to the first filter element FE1. The first column describes the slot selected and the next two columns describe in which sub-band lies respectively: the high-pass cut-on wavelength $\lambda_{HP}$ and low-pass cut-off wavelength $\lambda_{LP}$ for that slot. The second three columns describe the same for the second filter element FE2. The final column shows in which sub-band the resultant selected wavelength will lie.

TABLE 1

| First filter element FE1 | | | Second filter element FE2 | | | Selected |
| --- | --- | --- | --- | --- | --- | --- |
| Slot | $\lambda_{HP}$ | $\lambda_{LP}$ | Slot | $\lambda_{HP}$ | $\lambda_{LP}$ | Sub-band |
| S11 | B1 | B2 | S23 | n/a (LPF) | B1 | B1 |
| S11 | B1 | B2 | S21 | B2 | B3 | B2 |
| S12 | B3 | B4 | S21 | B2 | B3 | B3 |
| S12 | B3 | B4 | S22 | B4 | n/a (HPF) | B4 |

For example, the final row indicates that a wavelength in sub-band B4 can be selected by orienting first filter element FE1 such that the slot S12 is selected, and the second filter element FE2 is oriented such that the slot S22 is selected (e.g., high-pass filter HPF only region).

Tables 2 and 3 below shows how overall switching time is reduced by reducing the number of largest (i.e., 180 degree) rotations required. Again, the table shows the situation for the specific example of FIG. 4, but the concepts are more generally applicable. In each table, the rows are the sub-band corresponding to the starting wavelength, the columns are the sub-band of the wavelength being switched to and each entry is the approximate rotational distance (angle) required to make the switch (e.g., if the wavelength in each case is in the middle of each sub-band).

TABLE 2

| | B1 | B2 | B3 | B4 |
| --- | --- | --- | --- | --- |
| B1 | — | 90 | 180 | 90 |
| B2 | 90 | — | 90 | 180 |
| B3 | 180 | 90 | — | 90 |
| B4 | 90 | 180 | 90 | — |

TABLE 3

| | B1 | B2 | B3 | B4 |
| --- | --- | --- | --- | --- |
| B1 | — | 90 | 90 | 180 |
| B2 | 90 | — | 90 | 90 |
| B3 | 90 | 90 | — | 90 |
| B4 | 180 | 90 | 90 | — |

Table 2 illustrates the present arrangement (e.g., as described by FIG. 3) where the cut-off wavelength location varies linearly across most or all of the full 360 degrees of the filter element, for both the low-pass and high pass filter elements. It will be appreciated then, that the two elements need to be rotated together through (approximately) 180 degrees to select a wavelength in sub-band B3, when switching from a wavelength in sub-band B1 (and vice versa) and similarly to select a wavelength in sub-band B4, when switching from a wavelength in sub-band B2 (and vice versa). Therefore, there are two 180 degree switches. Table 3 is the equivalent table for the arrangement of FIG. 4. Here it can be seen that the only 180 degree switch comprises a switch from the lowest sub-band B1 to the highest sub-band B4 (and vice versa). Therefore, the number of potential 180 degree (more specifically, >90 degree) rotations is reduced.

It will of course be appreciated that the specific arrangement of FIG. 4 is purely exemplary, and different filter combinations may be used and/or the arrangement of the slots may differ, as of course may the order of the filter elements, while achieving some or all of the advantages described. What is relevant is that the transmission characteristics of the slots (or regions) are such that, for each of said sub-bands: one filter element comprises a slot defining a cut-on edge at a cut-on wavelength which is variable within that sub-band, and the other filter element comprises a slot defining a cut-off edge at a cut-off wavelength which is variable within that sub-band.

Figure 7:
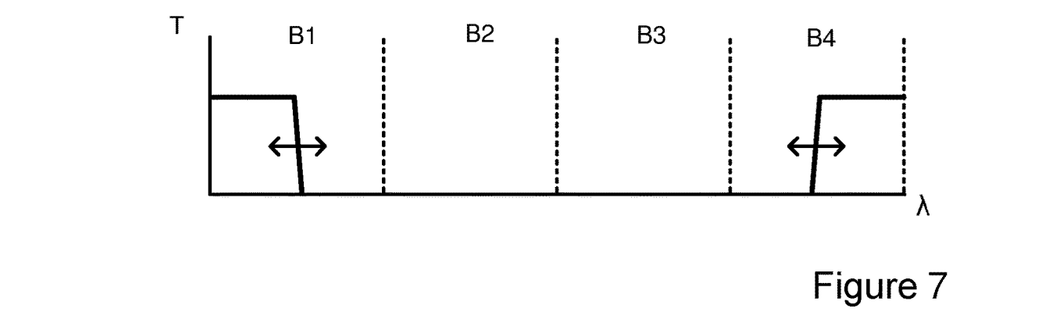
FIG. 7 shows a transmission spectrum for a region of the second filter element in a variation of the filter element pair of FIG. 4 according to a second embodiment of the invention.

In a further optimization, it is proposed that the high pass filter of slot S22 and low pass filter of slot S23 on filter element FE2 be combined into a band-stop filter. This may require a special coating, for example. FIG. 7 illustrates the transmission spectrum of such a slot. Referring to FIG. 4, it is proposed that slot S22, for example, comprises the band-stop filter arrangement described by FIG. 7, with slot S23 now also being empty (i.e., only two slots per filter element is required). An additional advantage of this arrangement is illustrated by Table 4 below, which shows that a switch between any of the two sub-bands never requires a move of more than 90 degrees.

TABLE 4

| | B1 | B2 | B3 | B4 |
| --- | --- | --- | --- | --- |
| B1 | — | 90 | 90 | 90 |
| B2 | 90 | — | 90 | 90 |
| B3 | 90 | 90 | — | 90 |
| B4 | 90 | 90 | 90 | — |

In a second embodiment, a color section module may comprise a single (e.g., rotatably mounted) filter element having two (or more) spatially separate filters (e.g., LVTs). In present, single filter examples, the LVT may extend substantially over the full extent of the filter; e.g., extend over close to the full 360 degrees of a rotationally mounted filter wheel. One of the major limitations in increasing the switching speed of such a color section module is the large rotation angle potentially required to select a desired wavelength.

Figure 8A:
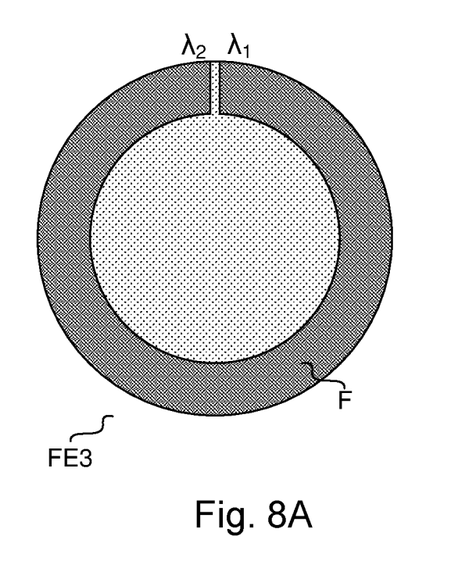
FIGS. 8A-8D show a prior art filter element; and 8B-8D alternative filter elements usable in a color selection arrangement according to additional embodiments of the invention.

FIG. 8 illustrates such an embodiment, FIG. 8(a) shows a prior art filter element FE3 comprising a filter F which extends substantially over 360 degrees. The filter F is an LVT having a range between $\lambda_1$ to $\lambda_2$ (e.g., 400 nm to 900 nm).

Figure 8B:
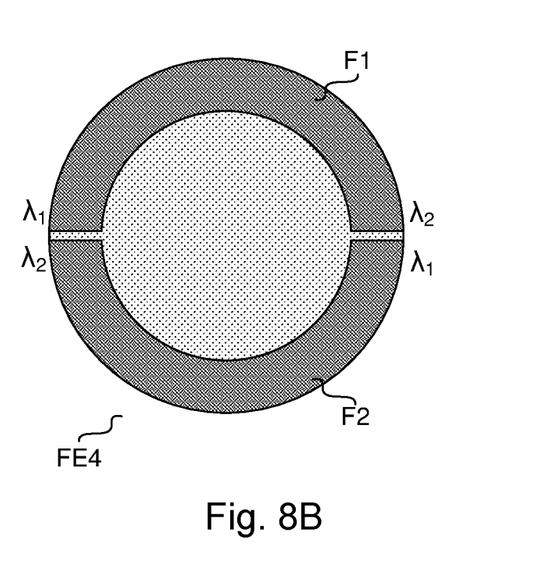

FIG. 8(b) shows a filter element FE4 according to an embodiment comprising two similar or identical filters F1, F2 (more than two such filters may be provided). In an embodiment, the filters F1, F2 may each cover the same or similar wavelength range ($\lambda_1$-$\lambda_2$) as used on present filter elements such as FIG. 8(a). However, in such an embodiment, the wavelengths will now be spread over a smaller angular range of the filter element, enabling faster switching. The two filters F1, F2 may be arranged as shown, with the lower extreme of each filter being adjacent to the higher extreme of the other filter.

Figure 8C:
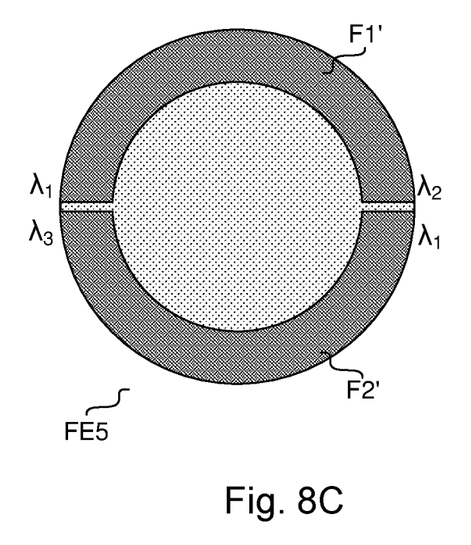

FIG. 8(c) shows a filter element FE5 according to further embodiments, where the range of a second filter F2' (e.g., extending over the same or similar spatial/angular range) has a substantially narrower wavelength range than a first filter F1'. The narrower range may be a subset of (or at least overlap) the range covered by the first filter F1'. In the example shown here first filter F1' comprises a range of $\lambda_1$ to $\lambda_2$ (e.g., 400 nm to 900 nm) and the second filter comprises a range of $\lambda_3$ to $\lambda_2$ (e.g., 700 nm to 900 nm). For certain applications, (e.g., measurements relating to 3DNAND), a very small bandwidth is required, consequently requiring a high slope steepness. This can be realized by a dedicated filter F2' with a short wavelength range over its full trajectory.

Figure 8D:
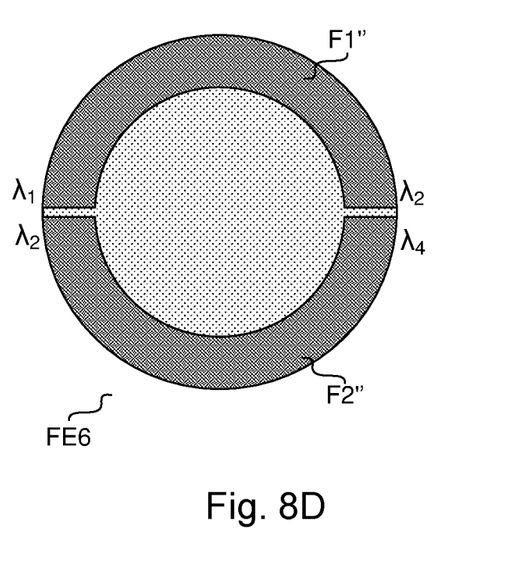

In another variation FE6 of this embodiment, illustrated in FIG. 8(d), the range of a second filter F2" may comprise a wider range of the first filter F1", and may encompass wavelengths not encompassed by typical color selection modules used presently. For example, the range may extend into the infra-red (IR) region. In such an example, the wider range of the second filter F2' may, or may not, overlap the range of the first element F1'. By way of specific example, the first filter F1' may comprise a range of $\lambda_1$ to $\lambda_2$ (e.g., 400 nm to 900 nm) and the second filter comprises a range of $\lambda_2$ to $\lambda_4$ (e.g., 900 nm to 2000 nm).

Further embodiments according to the present invention are described in below numbered clauses:

1. A wavelength selection module for a metrology apparatus comprising:
   one or more filter elements being operable to receive an input radiation beam comprising multiple wavelengths to provide selective control of a wavelength characteristic of a corresponding output radiation beam;
   wherein at least one of said one or more filter elements comprises at least two linear variable filters.
2. A wavelength selection module according to clause 1, wherein said at least two linear variable filters comprise at least one overlapping band-pass pair of linear variable filters, said band-pass pair of linear variable filters comprising a short pass linear variable filter and a long wavelength path linear variable filter which together provide a band pass linear variable filter.
3. A wavelength selection module according to clause 2, comprising a pair of said filter elements in series wherein at least one of said filter elements comprises said at least one overlapping band-pass pair of linear variable filters.
4. A wavelength selection module according to clause 3, wherein each of said pair of filter elements comprises a plurality of different regions having different transmission characteristics, at least some of said regions comprising either:
   a respective band-pass pair of linear variable filters defining a respective pass-band,
   a respective band-stop pair of linear variable filters defining a respective stop-band,
   a single short pass linear variable filter, or
   a single long pass linear variable filter.
5. A wavelength selection module according to clause 4, wherein each of said band-pass pairs of linear variable filters defines a different pass-band within a total wavelength range of the wavelength selection module.
6. A wavelength selection module according to clause 4 or 5, wherein said total wavelength range of the wavelength selection module is divided into a plurality of sub-bands, and the transmission characteristics of the regions are such that, for each of said sub-bands:
   a first filter element of said pair of filter elements comprises a region defining a cut-on edge at a cut-on wavelength which is variable within said sub-band, and
   a second filter element of said pair of filter elements comprises a region defining a cut-off edge at a cut-off wavelength which is variable within said sub-band.
7. A wavelength selection module according to clause 6, wherein said number of sub-bands numbers four, and comprises sequentially: a first sub-band, a second sub-band, a third sub-band and a fourth sub-band and wherein:
   said first filter element comprises:
      a first region comprising a first overlapping band-pass pair of linear variable filters defining a first pass band which is variable over substantially said first sub-band and said second sub-band, and
      a second region comprising a second overlapping band-pass pair of linear variable filters defining a second pass band which is variable over substantially said third sub-band and said fourth sub-band; and
   said second filter element comprises:
      a third region comprising a third overlapping band-pass pair of linear variable filters defining a third pass band which is variable over substantially said second sub-band and said third sub-band.
8. A wavelength selection module according to clause 7, wherein said second filter element further comprises:
   a fourth region comprising at least a short pass linear variable filter with cut-off wavelength variable within said first sub-band; and
   a fifth region comprising at least a long pass linear variable filter with cut-on wavelength variable within said fourth sub-band.
9. A wavelength selection module according to clause 7, wherein said second filter element further comprises:
   a fourth region comprising a first overlapping band-stop pair of linear variable filters defining a stop-band having a first edge variable within said first sub-band and a second edge variable within said fourth sub-band.
10. A wavelength selection module according to clause 1, comprising a single filter element having said at least two linear variable filters, wherein said at least two linear variable filters comprises a first linear variable filter and second linear variable filter arranged spatially and/or angularly separate on said filter element.
11. A wavelength selection module according to clause 10, wherein said first linear variable filter and said second linear variable filter are similar or identical.
12. A wavelength selection module according to clause 11, wherein said first linear variable filter and said second linear variable filter are arranged such that their opposite extremes are adjacent one another.
13. A wavelength selection module according to clause 10, wherein first linear variable filter comprises a narrower wavelength range than said second linear variable filter.
14. A wavelength selection module according to clause 13, wherein said first linear variable filter and said second linear variable filter each comprise the same or similar spatial and/or angular magnitude over the filter element.
15. A wavelength selection module according to clause 13 or 14, wherein the narrower wavelength range of the second linear variable filter comprises a sub-band of the range of said first linear variable filter.
16. A wavelength selection module according to clause 13, 14, or 15 wherein the range of at least one of said first linear variable filter and said second linear variable filter extends into infra-red wavelengths.
17. A wavelength selection module according to any preceding clause, wherein each of said one or more filter elements are rotatably mounted with a wavelength selected by rotating at least one of said one or more filter elements with respect to the input radiation beam.
18. An illumination system for a metrology apparatus comprising:
   an illumination source for generating said input radiation beam; and
   the wavelength selection module of any preceding clause.

19. A metrology apparatus for measuring a parameter of a lithographic process, the metrology apparatus comprising the illumination system of clause 18.

20. A metrology apparatus according to clause 19 comprising:
a support for said substrate having a plurality of targets thereon; and
an optical system for measuring each target with measurement radiation, wherein said measurement radiation comprises said output radiation beam.

21. A metrology apparatus according to clause 20 being operable to change said wavelength characteristic of the radiation beam between performing different measurements on a single substrate.

22. A metrology apparatus according to clause 20 being operable to change said wavelength characteristic of the radiation beam between performing different measurements on a single metrology target.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A wavelength selection module comprising:
a pair of rotatably mounted filter elements disposed in series being operable to receive an input radiation beam comprising multiple wavelengths to provide selective control of a wavelength characteristic of a corresponding output radiation beam,
wherein at least one of the filter elements comprises at least one overlapping band-pass pair of linear variable filters,
wherein each of the pair of filter elements comprises a plurality of different regions having different transmission characteristics, such that the wavelength selection module is operable to select a desired narrow pass band with a variable center frequency by having a combination of at least two of any of:
a respective band-pass pair of linear variable filters defining a respective pass band,
a respective band-stop pair of linear variable filters defining a respective stop-band,
a single short pass linear variable filter, and
a single long pass linear variable filter,
wherein each of the pair of filter elements is configured to rotate in-plane to allow the input radiation beam to be incident on a selected one of the plurality of different regions of each of the filter elements, and
a controller configured to rotate one or both of the pair of filter elements to select the desired narrow pass band with variable center frequency.

2. The wavelength selection module of claim 1, wherein the at least two linear variable filters comprise the at least one overlapping band-pass pair of linear variable filters, the band-pass pair of linear variable filters comprising a short pass linear variable filter and a long wavelength path linear variable filter that together provide a band pass linear variable filter.

3. The wavelength selection module of claim 1, wherein each of the band-pass pairs of linear variable filters, defines a different pass band within a total wavelength range of the wavelength selection module.

4. The wavelength selection module of claim 1, wherein the total wavelength range of the wavelength selection module is divided into a plurality of sub-bands, wherein transmission characteristics of the regions are such that, for each of the sub-bands:
a first filter element of the pair of filter elements comprises a region defining a cut-on edge at a cut-on wavelength that is variable within the sub-band; and
a second filter element of the pair of filter elements comprises a region defining a cut-off edge at a cut-off wavelength that is variable within the sub-band.

5. The wavelength selection module of claim 4, wherein the number of sub-bands is four, and comprises sequentially: a first sub-band, a second sub-band, a third sub-band and a fourth sub-band, and wherein:
the first filter element comprises:
a first region comprising a first overlapping band-pass pair of linear variable filters defining a first pass band that is variable over substantially the first sub-band and the second sub-band; and
a second region comprising a second overlapping band-pass pair of linear variable filters defining a second pass band that is variable over substantially the third sub-band and the fourth sub-band; and
the second filter element comprises:
a third region comprising a third overlapping band-pass pair of linear variable filters defining a third pass band that is variable over substantially the second sub-band and the third sub-band.

6. The wavelength selection module of claim 5, wherein the second filter element further comprises:

a fourth region comprising at least a short pass linear variable filter with a cut-off wavelength variable within the first sub-band; and a fifth region comprising at least a long pass linear variable filter with a cut-on wavelength variable within the fourth sub-band.

7. The wavelength selection module of claim 5, wherein the second filter element further comprises:

a fourth region comprising a first overlapping band-stop pair of linear variable filters defining a stop-band having a first edge variable within the first sub-band and a second edge variable within the fourth sub-band.

8. The wavelength selection module of claim 1, comprising a single filter element having the at least two linear variable filters, wherein the at least two linear variable filters comprise a first linear variable filter and second linear variable filter arranged spatially and/or angularly separate on the single filter element.

9. The wavelength selection module of claim 8, wherein the first linear variable filter and the second linear variable filter are identical.

10. The wavelength selection module of claim 9, wherein the first linear variable filter and the second linear variable filter are configured such that their opposite extremes are adjacent to one another.

11. The wavelength selection module of claim 8, wherein the first linear variable filter comprises a narrower wavelength range than the second linear variable filter.

12. The wavelength selection module of claim 11, wherein the first linear variable filter and the second linear variable filter each comprise the same spatial and/or angular magnitude over the single filter element.

13. The wavelength selection module of claim 11, wherein the second linear variable filter comprises a sub-band of the range of the first linear variable filter.

14. A lithography system comprising the wavelength selection module of claim 1.

15. A metrology system comprising the wavelength selection module of claim 1.

16. The wavelength selection module of claim 1, wherein each of the filter elements are configured to rotate independently with an individually controllable angular position.

17. The wavelength selection module of claim 1, wherein the plurality of different regions are arranged such that a rotational distance to switch between any two of the plurality of different regions is no more than about 90 degrees so as to minimize a wavelength selection time.

* * * * *